United States Patent [19]

Masterton

[11] Patent Number: 5,101,955
[45] Date of Patent: Apr. 7, 1992

[54] FEEDER FOR PLACEMENT OF COMPONENTS

[75] Inventor: Patrick J. Masterton, Carol Stream, Ill.

[73] Assignee: Motorola, Inc., Schaumburg, Ill.

[21] Appl. No.: 612,739

[22] Filed: Nov. 14, 1990

[51] Int. Cl.⁵ .......................................... B65G 47/24
[52] U.S. Cl. ................................. 198/390; 198/953
[58] Field of Search .............. 198/383, 390, 950, 388

[56] References Cited

U.S. PATENT DOCUMENTS 3,542,185 11/1970 Geyer .................. 198/953 X
4,419,645 12/1983 Lennon .
4,901,432 2/1990 Pine .

FOREIGN PATENT DOCUMENTS 211215 9/1987 Japan ................................... 198/390
18218 1/1990 Japan ................................... 198/388
2174378 11/1986 United Kingdom ................ 198/388

Primary Examiner—D. Glenn Dayoan
Attorney, Agent, or Firm—Susan L. Lukasik; Raymond A. Jenski

[57] ABSTRACT

Orienting air-wound coils for placement by an automatic pick-and-place machine has been a problem for small electronic coils. Extracting damaged or deformed coils on a one-by-one basis is expensive and time-consuming. A feeder for air-wound coils uses a rod (101), a track (103), and a two-segment guide (105, 107) and has built-in mechanisms for rejecting damaged coils while feeding undamaged coils (111, 113) in the proper orientation to a pick-and-place machine.

15 Claims, 1 Drawing Sheet

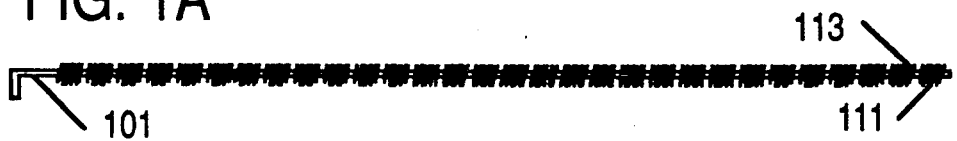
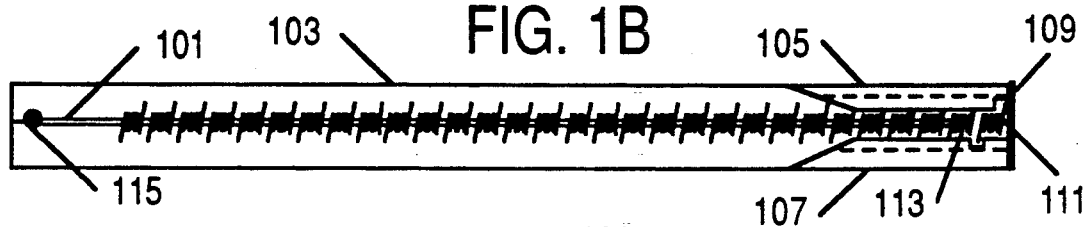
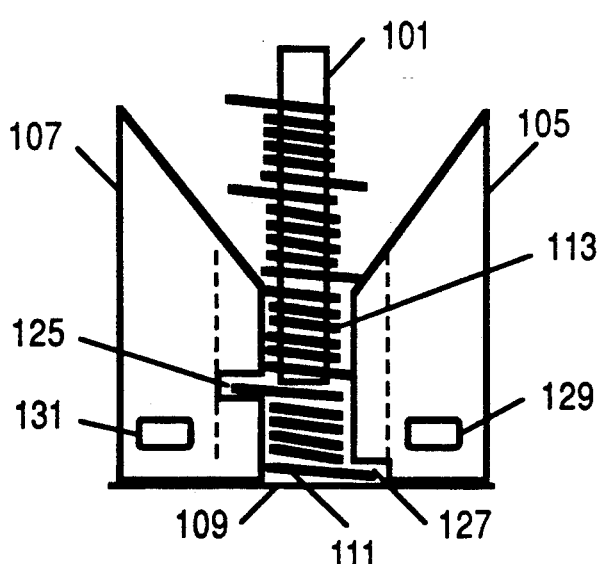
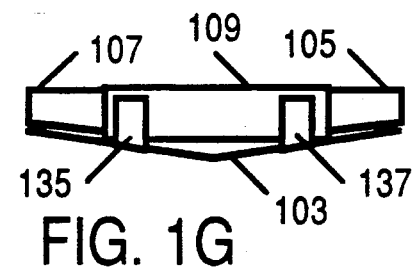
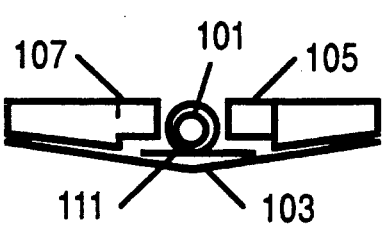

5,101,955

FEEDER FOR PLACEMENT OF COMPONENTS

FIELD OF THE INVENTION

This invention relates to automatic mounting techniques for electronic components and more particularly to an apparatus for accurately positioning components such as air-wound coils for placement on a substrate.

BACKGROUND OF THE INVENTION

Air-wound coils, or simply coils, are used as inductors in electrical circuits and come in a variety of different sizes, varying both in diameter and in the number of turns. Their geometric configuration makes them very difficult to present in precise orientation by pick-and-place or robotic equipment for automatic mounting on printed circuit boards (PCB's) or the like. Traditionally, vibratory bowl feeders have been used to present air-wound coils for automatic placement. These feeders are effective when the coils are large in diameter and have many turns, but they are expensive. For many newer products, such as high-frequency radios and cellular telephones, small one, two, or three turn coils are required. These coils become entangled in vibratory bowl feeders and therefore have to be manually placed in position.

Damaged coils also present a problem. Unless parts have been individually inspected before placement, a time-consuming and expensive process, a damaged coil can easily get caught in the feeder, causing repair costs for the feeder and lost production time. If a damaged part, such as an inductor, is placed on a PCB, the board will behave defectively since proper inductor operation depends on the exact geometry of the coil.

Accordingly, there is a need for an apparatus for accurately orienting undamaged components that enables various sizes of components to be inexpensively, quickly, and easily presented in the correct orientation for mounting.

SUMMARY OF THE INVENTION

The invention encompasses an apparatus for presenting at least one component, having a hole with an axis and inner perimeter of predetermined dimensions, in a predetermined orientation. A rod having two ends is arranged to accept the at least one component essentially coaxially on the rod's outer perimeter. A guide having at least two ends is positioned at a first end of the rod and tangent to the rod. A stop is disposed at a first end of the guide. The rod is disposed along the longitudinal axis of a track having at least two ends and a longitudinal axis. The guide is disposed at a first end of the track, such that the at least one component slides along the rod and the track and through the guide until it rests at the stop.

BRIEF DESCRIPTION OF THE DRAWINGS

FIG. 1A is a side view of a rod with air-wound coils in accordance with the invention.

FIG. 1B is a top view of a feeder of air-wound coils in accordance with the invention.

FIG. 1C is a side view of a feeder of air-wound coils in accordance with the invention.

FIG. 1D is a magnified top view of one end of a feeder of air-wound coils in accordance with the invention.

FIG. 1E is a cross-sectional end view of a feeder of air-wound coils in accordance with the invention.

FIG. 1F is a cross-sectional end view of a rod with air-wound coils and cover in accordance with the invention.

FIG. 1G is an end view of a stop for a feeder of air-wound coils in accordance with the invention.

DESCRIPTION OF A PREFERRED EMBODIMENT

The following describes an apparatus for presenting undamaged air-wound coils, of various sizes, inexpensively, quickly, and easily in the correct orientation for mounting. Once the coil is placed in the correct orientation, it is ready for pick-up by an automatic pick-and-place machine.

The feeder is comprised primarily of three parts: a rod, a track, and a guide. Each of these parts is relatively inexpensive and easily constructed. In addition to these parts, a support structure and common vibratory feeder, such as an IC Stick Feeder Base model PM150 available from Zevatech, provide the remaining basics for the configuration of the preferred embodiment of the invention.

FIG. 1 shows several different views of a feeder for air-wound coils. Each view will be described later in more detail. No view is drawn to scale. Basically, the coils are placed in succession along the outer circumference of a straight rod 101, whose diameter is slightly less than the inner diameter of the coils. Once the rod 101 is loaded, all the coils are in the correct orientation if, when the rod is placed on a flat surface, all of the leads are in the plane tangent to both the flat surface and the bottom of the rod 101, i.e. no leads are sticking up in the air. The coils on the rod 101 are kept in this orientation by placing them in a hollow plastic tube 133 with a slot cut length-wise along the tube to allow space for the coil leads to stick out, as in FIG. 1F. The rod 101 is placed in the center of a track 103, between two sections of a guide 105, 107 placed at one end of the track, as shown in FIG. 1B. A stop 109 is placed at the end of the guide to prevent the coils from falling off and to provide a reference point for coil pick-up. The coils slide along the rod 101 (down the track 103) to the guide 105, 107, where the leads slide between the guide 105, 107 and the track 103. The hollow plastic tube 133 is removed when the rod is in place. The coil 111 furthest down the track rests against the stop 109 to wait for pick-up by the automatic pick-and-place machine (not shown). Two slots 125, 127 in the guide 105, 107 allow the leads of only the end coil 111 to pass through the guide on pick-up, as shown in FIG. 1D. The coil is picked at a right angle to the guide 105, 107, in the direction coming out of the paper. Once the end coil 111 is picked, the remaining coils on the rod 101 slide down and the next coil 113 in line is ready for pick-up.

FIG. 1A shows a side view of a rod with air-wound coils lined up on the outer circumference of the rod. In the preferred embodiment of the invention, the rod 101 is constructed with piano wire. Because the piano wire is obtained on a spool, once cut, its shape is like a ring with a break in it. The wire is drawn into a straight line with a lathe, as shown in FIG. 1A. One end of the rod 101 has a bend of approximately 90 degrees, forming a hook at the end, as can be seen at the left-hand side of FIG. 1A. The hook is used to stabilize the rod while it rests on the track. See description for FIG. 1B for further details. The hook also prevents the coils from sliding off one end while they are loaded at the other end of the rod. In the preferred embodiment, the rod 101 is approximately 60 cm long, and the hook protrudes approximately 0.5 cm to 1.0 cm from the main shaft of the rod 101, depending on the diameter of the rod 101.

In the preferred embodiment of the invention, the diameter of the rod is between 0.25 mm and 0.5 mm less than the inner diameter of the air-wound coil to be placed on the rod. For example, a coil with inner diameter of 5.00 mm is placed on a rod made of piano wire having an outer diameter of 4.5 cm to 4.75 cm. The reason for choosing the rod diameter in this fashion is to make identification of damaged coils easy, and to prevent them from being placed on a PCB. A smashed or deformed coil will not easily fit on a rod where the diameter is chosen in this fashion, and consequently such a coil is rejected. The invention will still feed coils if the diameter of the rod is smaller than that described above, but it will not prevent damaged coils from being placed on the board. Piano wire is cheap and easy to modify to any size coil. Hollow aluminum or plastic tubes can be used for much larger coils.

FIG. 1B is a top view of the feeder, showing the rod 101, track 103, and guide 105, 107 of the preferred embodiment of the invention. The track 103 is somewhat longer than the rod 101. A hole 115, approximately 2 mm larger in diameter than the rod 101, is placed near one end of the track 103, at the center of the width of the track 103. The hook in the rod 101 is placed in the hole 115, and the rod 101 is placed axially along the track 103. The guide 105, 107 is placed at the end of track 103 opposite the hole 115. The end of the rod 101 opposite the hook fits between the two sections of the guide 105, 107, and terminates slightly more than one coil length from the stop 109 placed at the end of the guide 105, 107. The stop 109 prevents the coils from falling off and to provides a reference point for coil pick-up. The leads of the coils slide between the guide and the track. The rod 101 is flexible enough to be bent slightly to allow the rod 101 with coils to be slid into the guide 105, 107 while placing the hook of the rod 101 into the hole 115 in the track 103.

FIG. 1C is a side view of a feeder of air-wound coils in accordance with the invention. The track 103 is a v-shaped piece of brass, approximately 65 cm long and 5 cm wide, in the preferred embodiment of the invention. Brass was chosen because it is easy to bend and coils slide easily along it. The track 103 is attached to a support structure consisting of two vertical members 117, 119 and a horizontal member 121. The end of the track 103 with the guide 105, 107 rests at one end of the horizontal member 121, and the bottom of the first vertical member 117 is attached to the other end of the horizontal member 121. The top of first vertical member 117 is attached to the end of the track 103 with the hole 115. The height of the first vertical member 117 is such that the angle between the horizontal member 121 and the track 103 allows the coils to slide down the track 103 under the force of gravity with the vibratory feeder 123. This angle is 5 degrees in the preferred embodiment of the invention. The angle is dependent on the weight of the coils and rod 101 and the material of the track 103, but is easily determined by trial and error. The top of vertical member 119 is attached to the center of the track 103, and affixed to the horizontal member 121, to prevent vibration of the track. The vibratory feeder 123 is placed under the horizontal member 121 at the end that the track 103 rests on and causes the coils to quickly slide down the rod 101.

FIG. 1D is a magnified top view of the guide end of the feeder. Note that the figure is not drawn to scale, as several coils may be between the segments of the guide 105, 107 at any time. As described for FIG. 1B, the end of the rod 101 is at least one coil length away from the stop 109. In the preferred embodiment of the invention, the rod 101 terminates 1.2 coil lengths from the stop 109, thus preventing damage to the coil leads when the rod 101 is terminated too short. The coil 111 resting at the stop has slid completely off the rod 101, but will not come out of the guide 105, 107 without being picked by a human or machine.

Except for the last coil 111, the leads of all the coils between the segments of the guide 105, 107 rest on the track 103 and under the guide 105, 107. A slot is cut in each section of the guide 105, 107 for each lead to allow the end coil 111 to be lifted off the track 103 at approximately a right angle to the guide 105, 107 in a direction coming out of the paper. The first slot 127 is cut in guide segment 105. The second slot 125 is cut in guide segment 107. These slots 125, 127 serve two purposes. They primarily allow the coil to be picked from the feeder without interference. Their secondary function is to point out coils with leads bent at an angle lengthwise. In the preferred embodiment of the invention, the slots 125, 127 are long enough to allow the leads to pass easily, and they are wide enough to allow 15 degree tolerance in the bend of the coil lead. If the leads of the end coil 111 are bent such that they are under the guide, the automatic pick-and-place machine will sound a warning because it cannot remove the coil, and an operator can manually remove the coil. The stop 109 can be designed, as shown in FIG. 1G, to be slid upwards between the guide 105, 107 and two brackets 135, 137, such that the defective coil can slide out of the track 103 easily, after which the stop 109 is slid back into place. A coil with leads bent toward the body of the coil may not slide under the guide 105, 107 initially, but an operator can simply bend the leads toward the track with pliers once that coil is isolated from the others.

A wide slot 129, 131 in each section of the guide 105, 107 is provided to allow the guide 105, 107 to be attached to the track 103. These slots 129, 131 are wide to allow the guide to be adjusted to the diameter of the coils. Strategic placement on the track 103 of each segment of the guide 105, 107 allows various sizes of coils to be fed through one guide 105, 107. Different slots 125, 127 in different guides allow for vastly different coil sizes and different tolerances to bent leads. In the preferred embodiment of the invention, the guide 105, 107 is made of aluminum because it is inexpensive and easy to shape.

FIG. 1E is a cross-sectional end view of the feeder, looking down the track 103 from the end with the guide 105, 107, with the stop 109 removed. This view shows the v-shaped nature of the track 103. The bend is down the center of the track 103 width-wise, where the rod 101 and coils rest while in place on the track 103. The position of the coils (all in succession behind the end coil 109) with respect to the guide 105, 107 is clearly visible from this view, where the body of the end coil 111 has clearance between the segments of the guide 105, 107, but the leads of the coil 111 do not. The leads of the coils rest on the track 103 and below the guide 105, 107, which is shaped to allow space for the coil leads to pass without touching.

FIG. 1F is a cross-sectional end view of a rod with airwound coils and cover in accordance with the invention. This end view shows the rod 101 with coils placed in succession on the outer circumference of the rod 101. Once the rod 101 is loaded with coils and ready for placement on the track 103, a hollow plastic tube 133, the length of the rod 101, is used as a cover to keep all the coils in the same orientation until the rod 101 is in place on the track. The diameter of the hollow plastic tube 133 is slightly larger than the outer diameter of the coils, with a slot cut length-wise along the tube, approximately 90 degrees wide to allow space for the coil leads to stick out, but to keep all the leads in the same orientation. The hollow plastic tube 133 is removed when the rod 101 is securely and correctly in place on the track 103.

What is claimed is:

1. An apparatus for presenting at least one component, having a hole with an axis and inner perimeter of predetermined dimensions, comprising:
   a rod having two ends and arranged to accept the at least one component essentially coaxially on said rod's outer perimeter;
   a guide having at least two sections and positioned at a first end of said rod and parallel to said rod;
   a stop disposed at a first end of said guide; and
   a track having at least two ends and a longitudinal axis and along which longitudinal axis said rod is disposed, said first end of said guide being disposed at a first end of said track, such that the at least one component slides along said rod and said track and between said at least two sections of said guide until it rests at said stop.

2. The apparatus of claim 1 wherein said rod further comprises a rod having an outer perimeter having dimensions less than said inner perimeter dimensions of the at least one component and such that the at least one component, if deformed, cannot easily slide on said rod.

3. The apparatus of claim 1 wherein said track is disposed at an angle to the horizontal where said first end is lower than a second end such as to allow gravity to cause the at least one component to slide along said rod.

4. The apparatus of claim 1 wherein said apparatus further comprises means for allowing repositioning of said stop.

5. An apparatus for presenting at least one component, having a hole with an axis and inner perimeter of predetermined dimensions, comprising:
   means for aligning having two ends and an outer perimeter and arranged to accept the at least one component essentially coaxially on said outer perimeter of said means for aligning;
   means for guiding having at least two sections and positioned at a first end of said means for aligning and parallel to said means for aligning;
   means for limiting travel of said at least one component disposed at a first end of said means for guiding; and
   means for positioning having at least two ends and a longitudinal axis and along which longitudinal axis said means for aligning is disposed, said first end of said means for guiding being disposed at a first end of said means for positioning, such that the at least one component slides along said means for aligning and said means for positioning and between said at least two sections of said means for guiding until it rests at said means for limiting.

6. The apparatus of claim 5 wherein said means for aligning further comprises means for aligning having an outer perimeter having dimensions less than said inner perimeter dimensions of the at least one component and such that the at least one component, if deformed, cannot easily slide on said means for aligning.

7. The apparatus of claim 5 wherein said means for positioning is disposed at an angle to the horizontal where said first end is lower than a second end such as to allow gravity to cause the at least one component to slide along said means for aligning.

8. The apparatus of claim 5 wherein said apparatus further comprises means for allowing repositioning of said means for limiting.

9. A method for presenting at least one component, having a hole with an axis and inner perimeter of predetermined dimensions, comprising the steps of:
   aligning said at least one component with a rod having two ends and an outer perimeter and arranged to accept the at least one component essentially coaxially on said outer perimeter of said rod;
   guiding said at least one component with a guide having at least two sections and positioned at a first end of said rod and parallel to said rod;
   limiting travel of said at least one component with a stop disposed at a first end of said guide; and
   positioning said at least one component with a track having at least two ends and a longitudinal axis and along which longitudinal axis said rod is disposed, said first end of said guide being disposed at a first end of said track, such that the at least one component slides along said rod and said track and between said at least two sections of said guide until it rests at said stop.

10. The method of claim 9 wherein said step of aligning further comprises the step of using a rod having an outer perimeter having dimensions less than said inner perimeter dimensions of the at least one component and such that the at least one component, if deformed, cannot easily slide on said rod.

11. The method of claim 9 wherein said step of positioning further comprises the step of disposing said track at an angle to the horizontal where said first end is lower than a second end such as to allow gravity to cause the at least one component to slide along said rod.

12. The method of claim 9 further comprising the step of repositioning said stop.

13. The apparatus of claim 1 wherein the at least one component rests at said stop in a predetermined orientation.

14. The apparatus of claim 5 wherein the at least one component rests at said means for limiting travel in a predetermined orientation.

15. The method of claim 9 wherein the at least one component rests at said stop in a predetermined orientation.

* * * * *